United States Patent
Guo et al.

(10) Patent No.: US 8,411,879 B2
(45) Date of Patent: *Apr. 2, 2013

(54) SPEAKER DRIVER CIRCUIT DRIVEN BY POSITIVE AND NEGATIVE VOLTAGES

(75) Inventors: Jwin-Yen Guo, Chupei (TW); Ching-Hsiang Yang, Taoyuan (TW)

(73) Assignee: Richtek Technology Corporation, Hsin-Chu (TW)

( * ) Notice: Subject to any disclaimer, the term of this patent is extended or adjusted under 35 U.S.C. 154(b) by 622 days.

This patent is subject to a terminal disclaimer.

(21) Appl. No.: 12/507,060

(22) Filed: Jul. 21, 2009

(65) Prior Publication Data

US 2009/0285416 A1    Nov. 19, 2009

Related U.S. Application Data

(63) Continuation-in-part of application No. 11/755,894, filed on May 31, 2007, now Pat. No. 7,991,172.

(51) Int. Cl.
*H03F 99/00* (2009.01)
*H03F 3/04* (2006.01)
*H04R 1/10* (2006.01)

(52) U.S. Cl. ............................. 381/120; 381/74; 330/250

(58) Field of Classification Search .................. 318/802; 330/297; 341/53; 345/94.98; 348/473; 381/74, 381/120, 323

See application file for complete search history.

(56) References Cited

U.S. PATENT DOCUMENTS

| | | | | |
|---|---|---|---|---|
| 5,306,954 | A * | 4/1994 | Chan et al. ................. | 307/110 |
| 5,831,679 | A * | 11/1998 | Montgomery et al. ........ | 348/473 |
| 5,856,736 | A * | 1/1999 | Rotunda et al. ............. | 318/802 |
| 7,991,172 | B2 * | 8/2011 | Fan et al. ................... | 381/120 |
| 2004/0095114 | A1 * | 5/2004 | Kernahan .................... | 323/282 |
| 2004/0095264 | A1 * | 5/2004 | Thomas ...................... | 341/53 |
| 2005/0110574 | A1 * | 5/2005 | Richard et al. ............. | 330/297 |
| 2006/0015841 | A1 * | 1/2006 | Bishop et al. .............. | 717/102 |
| 2006/0158413 | A1 * | 7/2006 | Morita ....................... | 345/94 |
| 2007/0252640 | A1 * | 11/2007 | Lin et al. ................... | 327/541 |

* cited by examiner

*Primary Examiner* — Fan Tsang
*Assistant Examiner* — Eugene Zhao
(74) *Attorney, Agent, or Firm* — Tung & Associates

(57) ABSTRACT

A speaker driver circuit driven by positive and negative voltages, comprising: at least one operational amplifier providing an output to a headphone speaker, and a voltage converter receiving a supplied voltage (VDD), generating r-fold positive and negative voltages (r·VDD and −r·VDD, wherein r is any positive real number except 1) according to the supplied voltage, and supplying the positive and negative voltages to the operational amplifier for its high and low operation voltage levels respectively.

6 Claims, 6 Drawing Sheets

SPEAKER DRIVER CIRCUIT DRIVEN BY POSITIVE AND NEGATIVE VOLTAGES

CROSS REFERENCE TO RELATED APPLICATIONS

This application is a continuation-in-part application of U.S. patent application Ser. No. 11/755,894, filed on May 31, 2007 now U.S. Pat. No. 7,991,172.

BACKGROUND OF THE INVENTION

1. Field of Invention

The present invention relates to a speaker driver circuit driven by positive and negative voltages.

2. Description of Related Art

FIG. 1 shows a typical structure of a conventional two-channel speaker driver circuit. In order to obtain a maximum dynamic range, the output of such conventional speaker is biased at a nominal DC voltage, which typically is half of a supplied voltage VDD (as an example, VDD=5V and VDD/2=2.5V in the shown figure). However, the DC bias causes significant amount of current to flow into the headphone speaker 16 and 18; this may, in addition to unnecessary power consumption, cause the speaker and the speaker driver to be damaged. Hence, the circuit requires capacitors Cdec to isolate the DC bias, and the capacitance of the capacitor Cdec is considerably large (in the range of several hundred μF).

The output waveform of this conventional headphone is shown in FIG. 2, in which the peak amplitude is VDD, the valley is 0, and the average is VDD/2.

In view of the problems caused by the DC bias, an improvement as shown in FIG. 3 is proposed, in which the low operation level of the two operational amplifiers is set to −VDD, so that the DC bias of the output voltage becomes 0. This eliminates the requirement of the large capacitors, but the circuit requires two operation voltages VDD and −VDD, and it is undesired to provide an additional I/O port for an external input of −VDD. Thus, this prior art proposes a charge pump 10, which converts the supplied voltage VDD to −VDD, so that the circuit only requires one voltage supply. The output waveform of this conventional headphone is shown in FIG. 4, in which the peak amplitude is VDD, the valley is −VDD, and the average is 0.

The second speaker driver circuit described above has the drawbacks that, if the supplied voltage VDD is high, since the output signal amplitude becomes double, the devices need to sustain higher voltage; and the power consumption also becomes double. On the other hand, if the supplied voltage VDD is low, the output signal may not have sufficient power to drive the speaker, and thus the signal amplitude should be enhanced. Accordingly, it is desired to provide a speaker driver circuit capable of generating peak and valley amplitudes of r·VDD and −r·VDD respectively, wherein r is any real number except 1.

SUMMARY OF THE INVENTION

In view of the foregoing, it is an objective of the present invention to provide an improved circuit to overcome the drawbacks in the prior art.

In accordance with the foregoing objective of the present invention, the present invention discloses a speaker driver circuit driven by positive and negative voltages, comprising: at least one operational amplifier providing an output to a headphone speaker, and a voltage converter receiving a supplied voltage (VDD), generating r-fold positive and negative voltages (r·VDD and −r·VDD, wherein r is any positive real number except 1) according to the supplied voltage, and supplying the positive and negative voltages to the operational amplifier for its high and low operation voltage levels respectively.

In one preferred embodiment, the abovementioned voltage converter includes one of the following circuits: non-synchronous boost-inverter circuit, synchronous boost-inverter circuit, direct current/direct current (DC/DC) voltage converter, and negative charge pump.

The objectives, technical details, features, and effects of the present invention will be better understood with regard to the detailed description of the embodiments below, with reference to the drawings.

DESCRIPTION OF THE PREFERRED EMBODIMENTS

Figure 1:
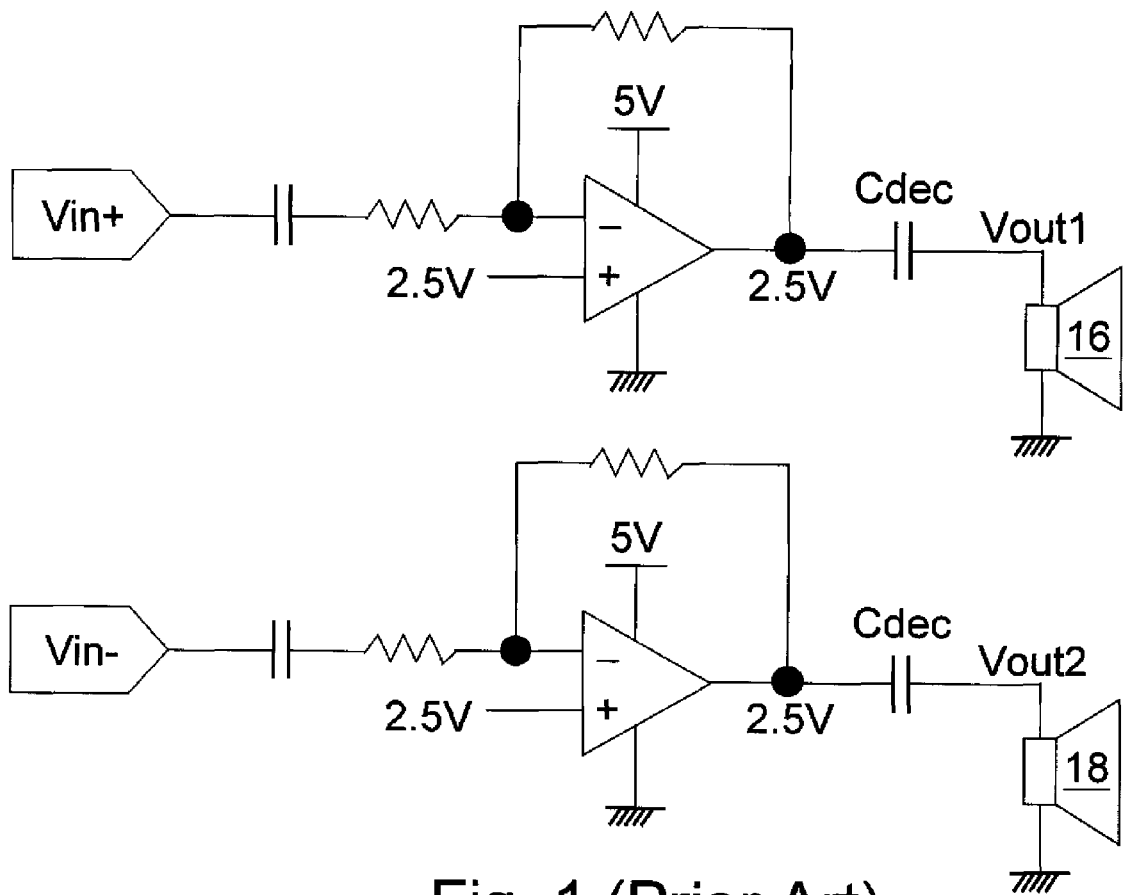
FIG. 1 is a schematic diagram showing a typical structure of a conventional two-channel speaker driver circuit.
Figure 2:
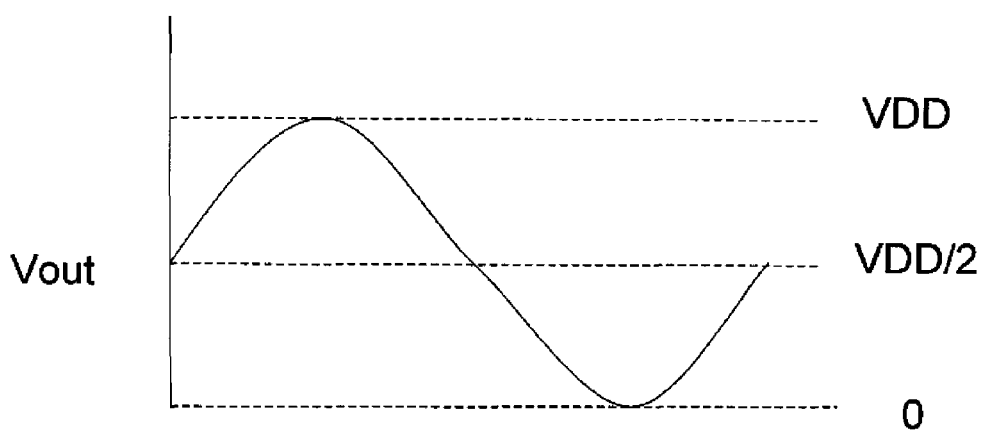
FIG. 2 is a corresponding waveform according to the circuit of FIG. 1.
Figure 3:
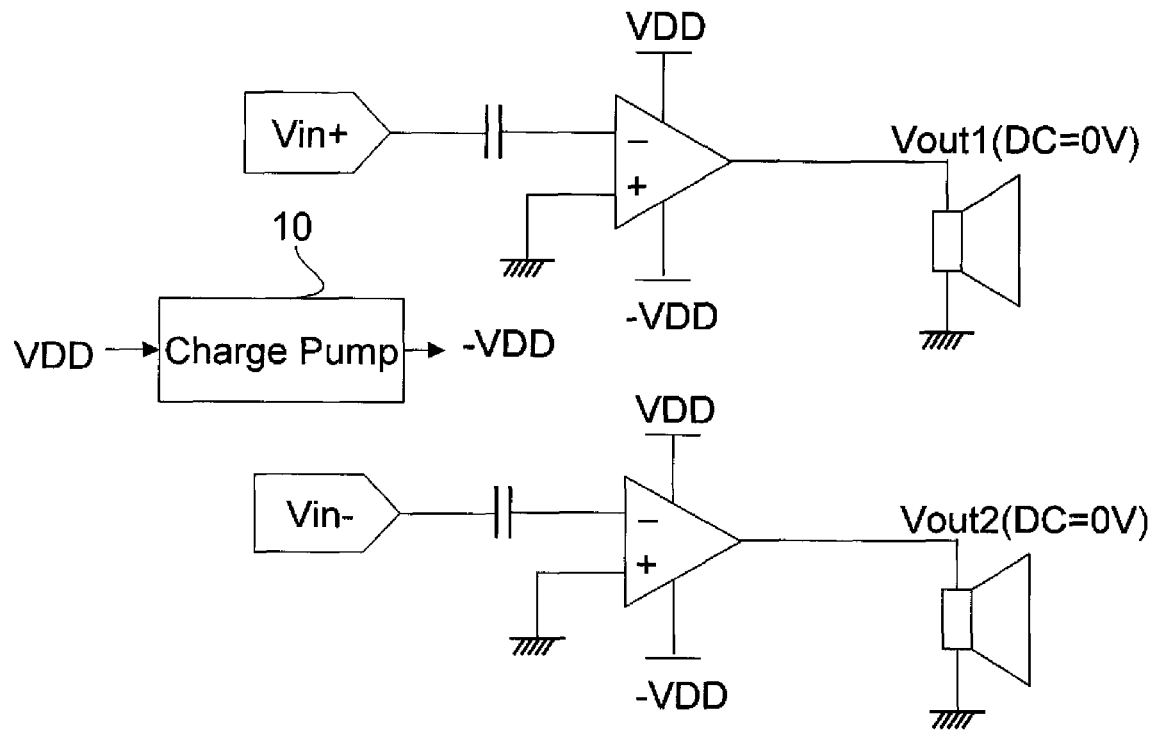
FIG. 3 is schematic diagram showing another conventional two-channel speaker driver circuit.
Figure 4:
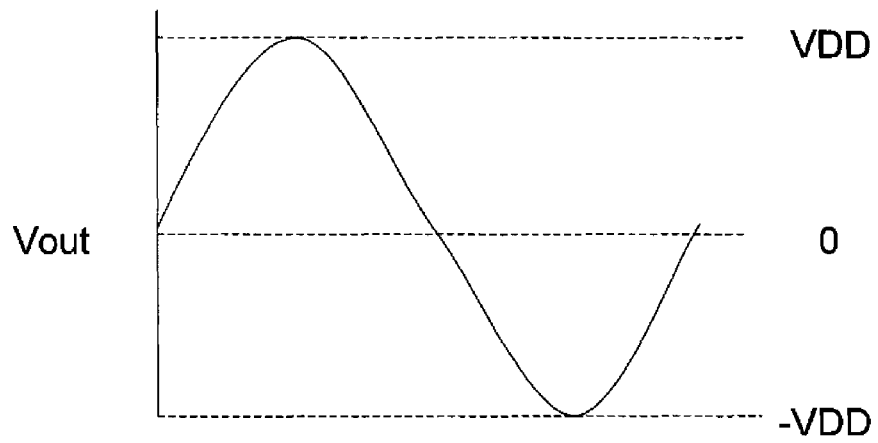
FIG. 4 is a corresponding waveform according to the circuit of FIG. 3.
Figure 5:
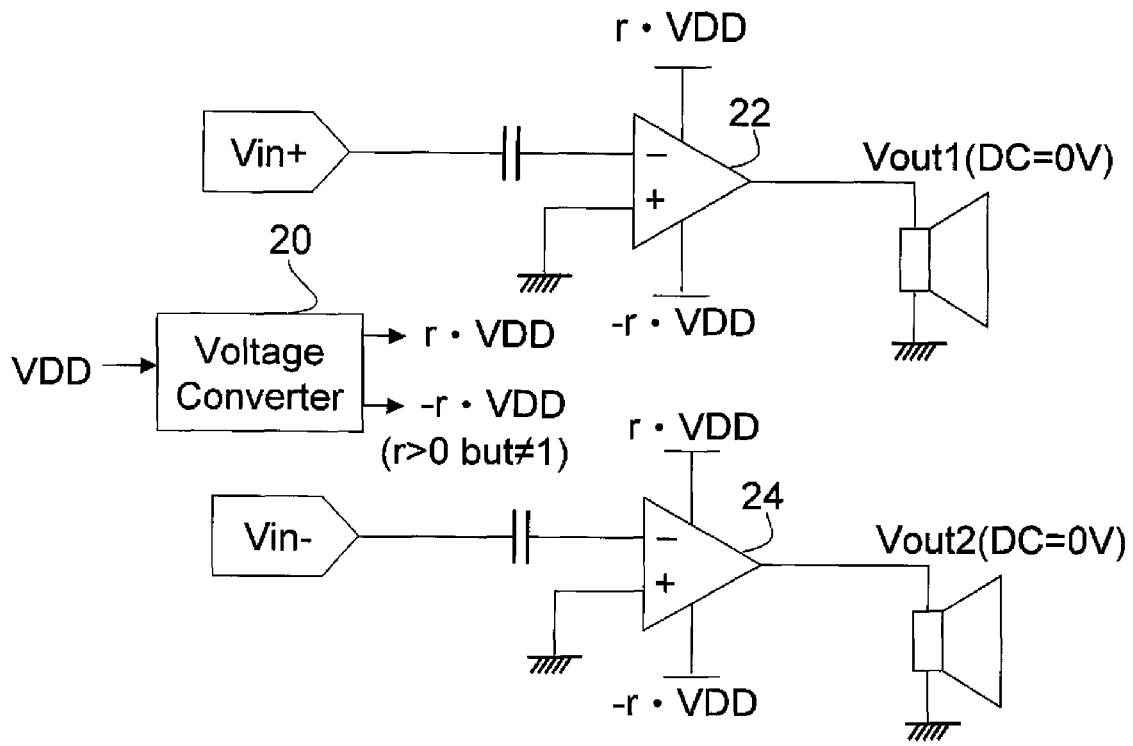
FIG. 5 is schematic diagram showing a preferred embodiment of the two-channel speaker driver circuit of the present invention.
Figure 6:
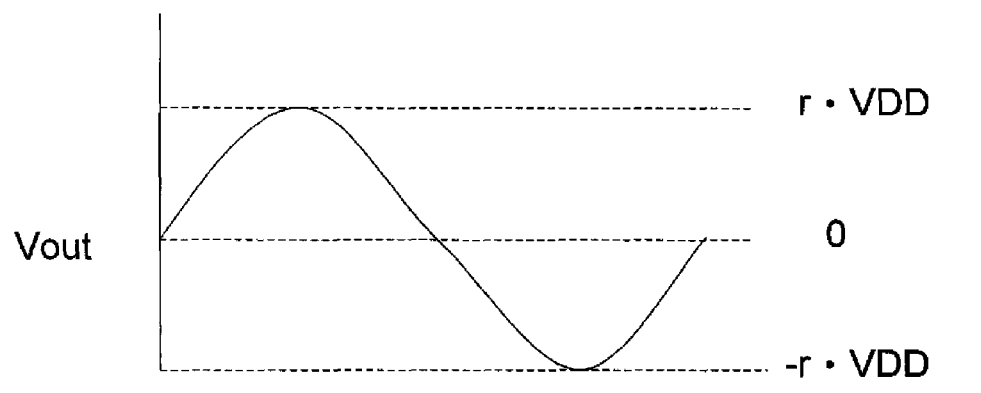
FIG. 6 is a corresponding waveform according to the circuit of FIG. 5.

Referring to FIG. 5, the difference of the present invention from the prior art is that it provides two operational amplifiers 22 and 24 having high and low operation levels of r·VDD and −r·VDD respectively, wherein r is any positive real number except 1, such that the DC bias of the output voltage is still 0, but the amplitude of the output voltage can be any value depending on the requirement of a next-stage circuit, such as a lower voltage to reduce power consumption or a higher voltage to increase driving strength, as shown in FIG. 6.

Figure 7:
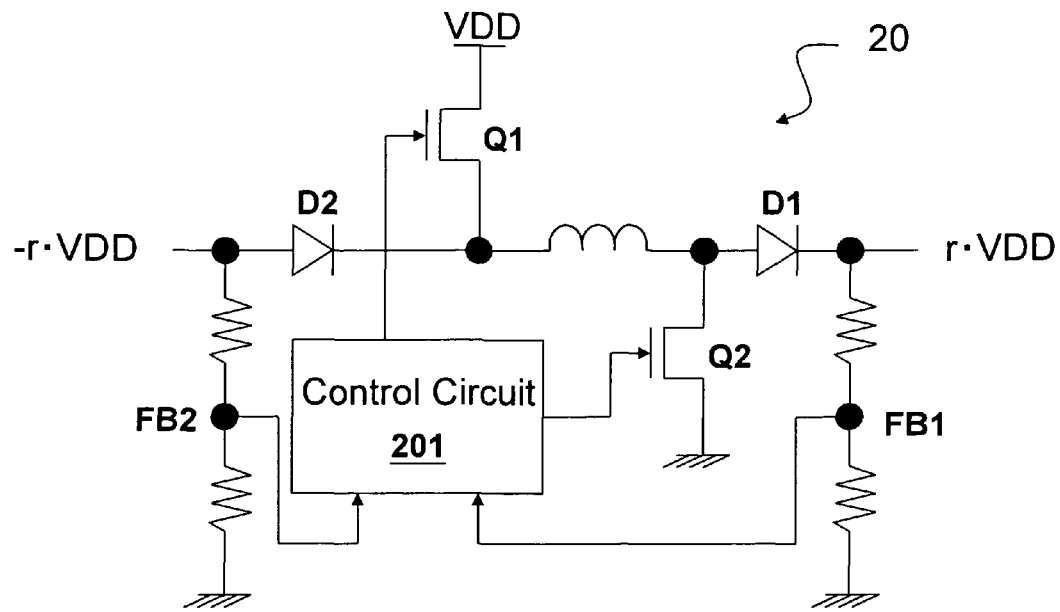
FIG. 7 shows, by way of example, an embodiment of the voltage converter 20 according to the present invention.

TO this end, the circuit requires generating two operation voltages, r·VDD and −r·VDD, as shown by a voltage converter 20 in the figure. Referring to FIG. 7, the voltage converter 20 can be embodied in many forms. The voltage converter 20 shown in this embodiment is a non-synchronous boost-inverter circuit. By operation of power switches Q1 and Q2, an input voltage Vin is converted to a positive output voltage r·VDD and a negative output voltage −r·VDD. The control circuit 201 generates power switch control signals to control the power switches Q1 and Q2 according to feedback signals FB1 and FB2. By feedback control mechanism, the positive and negative output voltages are maintained at r·VDD and −r·VDD respectively. The number r can be set in the control circuit 201 of which an example is given in FIG. 8.

Figure 8:
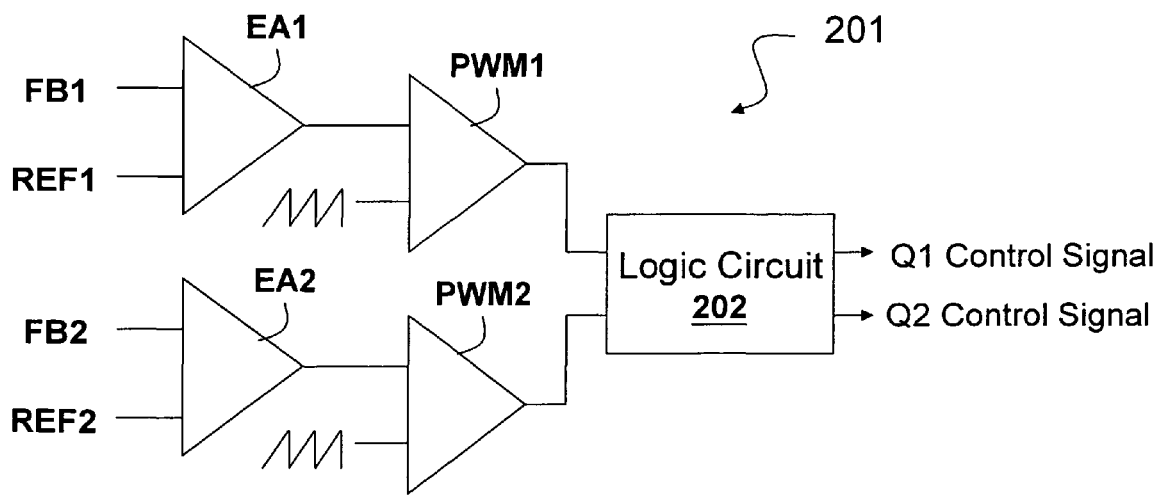
FIG. 8 shows, by way of example, an embodiment of the control circuit 201.

After the feedback signals FB1 and FB2 are compared with reference signals REF1 and REF2 in error amplifiers EA1 and EA2 respectively, the outputs from the error amplifiers EA1 and EA2 are compared with saw tooth signals in PWM comparators PWM1 and PWM2 respectively. A logic circuit 202 performs logic operation on the outputs from the PWM comparators PWM1 and PWM2 to generate control signals for the power switches Q1 and Q2. As shown in FIG. 8, by setting the reference signals REF1 and REF2, r can be determined.

Figure 9:
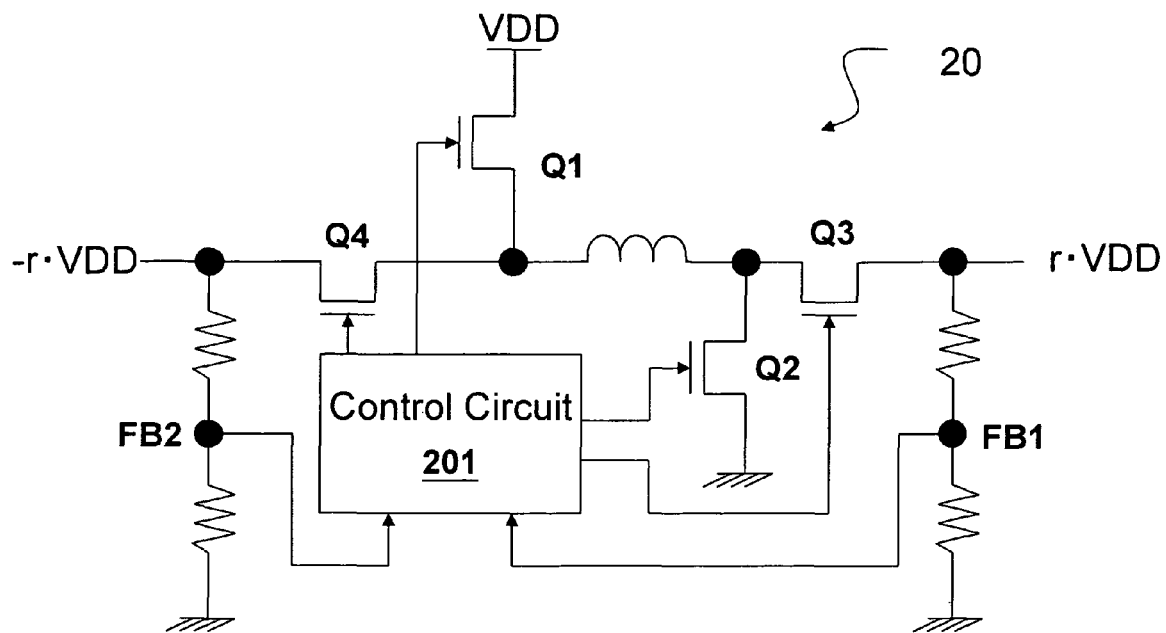
FIG. 9 shows, by way of example, another embodiment of the voltage converter 20.

The diodes D1 and D2 in the voltage converter 20 shown in FIG. 7 may be replaced by transistors Q3 and Q4 to form a synchronous boost-inverter circuit as shown in FIG. 9, which can provide the same function as well.

Figure 10:
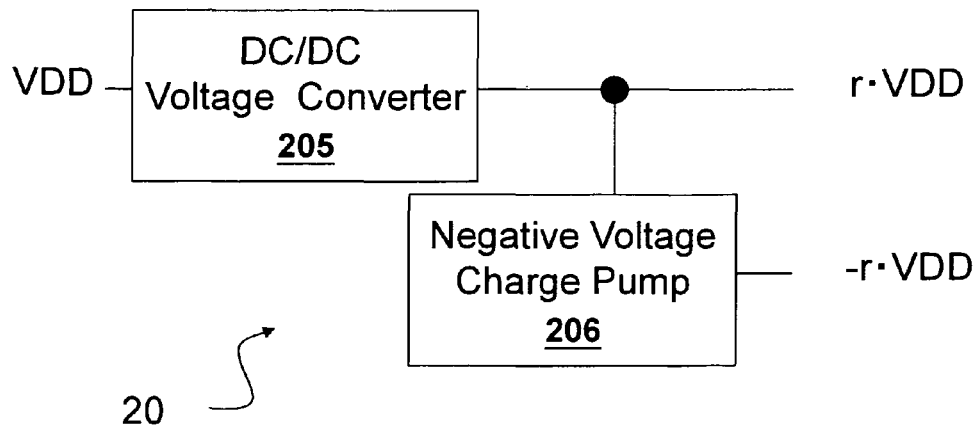
FIG. 10 shows, by way of example, yet another embodiment of the voltage converter 20.
Figure 11:
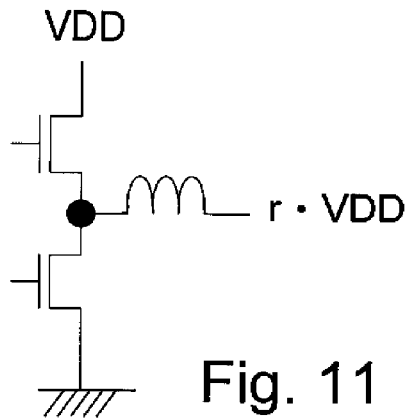
FIGS. 11-16 show several embodiments of the DC/DC voltage converter 205 in FIG. 10.
Figure 12:
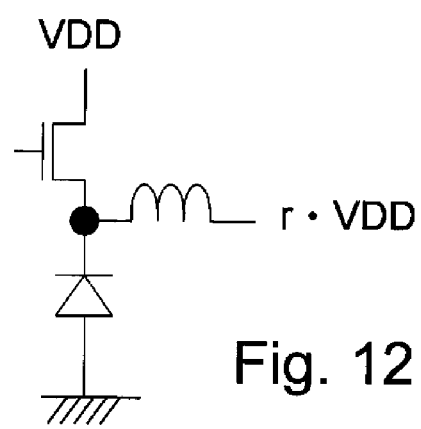
Figure 13:
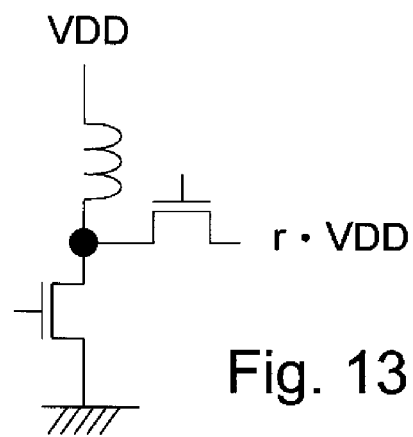
Figure 14:
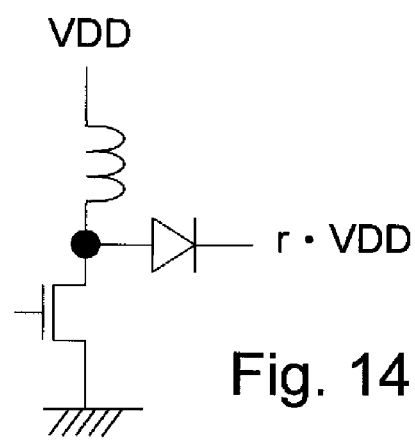
Figure 15:
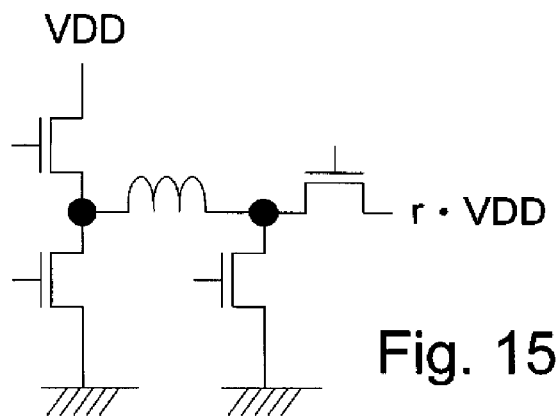
Figure 16:
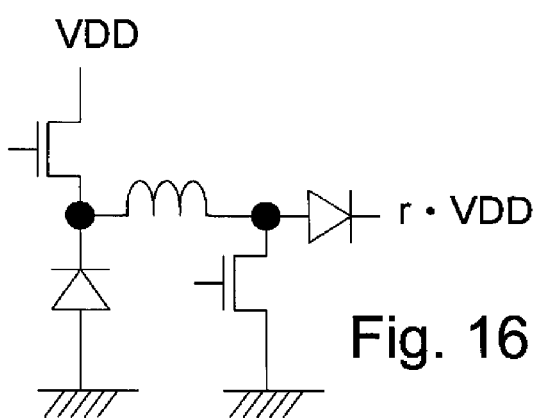

FIG. 10 shows another embodiment of the present invention. This embodiment employs a DC/DC voltage converter 205 to convert the voltage VDD to r·VDD, and next converts the voltage r·VDD to −r·VDD by a negative voltage charge pump 206. The DC/DC voltage converter 205 for example may be, but is not limited to: synchronous or non-synchronous type of buck converter, boost converter, buck-boost converter, etc., as shown in FIGS. 11-16.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the approach as shown in FIG. 10 to convert VDD to r·VDD first and next convert r·VDD to −r·VDD can be modified as: converting VDD to −r·VDD first and next converting −r·VDD to r·VDD. In view of the foregoing, the spirit of the present invention should cover all such and other modifications and variations, which should be interpreted to fall within the scope of the following claims and their equivalents.

What is claimed is:

1. A speaker driver circuit driven by positive and negative voltages, comprising:
    at least one operational amplifier providing an output to a speaker, and
    a boost-inverter voltage converter receiving a supplied voltage, generating r-fold positive and negative voltages (wherein r is any positive real number except 1) according to the supplied voltage, and supplying the positive and negative voltages to the operational amplifier as its high and low operation voltage levels respectively,
    wherein the boost-inverter voltage converter includes a power device coupled between the supplied voltage and a first switching node, a second power device coupled between the first switching node and the r-fold negative voltage, an inductor coupled between first switching node and a second switching node, a third power device coupled between the second switching node and the r-fold negative voltage, and a fourth power device coupled between the second switching node and ground.

2. The speaker driver circuit of claim 1 including two operational amplifiers having outputs supplied to two speakers respectively.

3. The speaker driver circuit of claim 1, wherein the boost-inverter voltage converter includes a non-synchronous boost-inverter circuit wherein the first power device and the third power device are transistors and the second power device and the fourth power device are diodes.

4. The speaker driver circuit of claim 1, wherein the boost-inverter voltage converter includes a synchronous boost-inverter circuit wherein the first, second, third and fourth power devices are transistors.

5. A speaker driver circuit driven by positive and negative voltages, comprising:
    at least one operational amplifier providing an output to a speaker, and
    a voltage converter receiving a supplied voltage, generating r-fold positive and negative voltages (wherein r is any positive real number except 1) according to the supplied voltage, and supplying the positive and negative voltages to the operational amplifier as its high and low operation voltage levels respectively,
    wherein the voltage converter includes: a direct current/direct current (DC/DC) voltage converter converting the supplied voltage to an r-fold voltage; and a negative charge pump converting the r-fold voltage to a negative voltage having the same absolute value as the r-fold voltage,
    wherein the DC/DC voltage converter includes one of the following circuits:
    a synchronous buck converter circuit including a first transistor coupled between the supplied voltage and a first switching node, a second transistor coupled between the first switching node and ground, and a first inductor coupled between the first switching node and the r-fold voltage,
    a non-synchronous buck converter circuit including a third transistor coupled between the su shied voltage and a second switching node, a first diode coupled between the second switching node and ground, and a second inductor coupled between the second switching node and the r-fold voltage,
    a synchronous boost converter circuit including a third inductor coupled between the supplied voltage and a third switching node, a fourth transistor coupled between the third switching node and ground, and a fifth transistor coupled between the third switching node and the r-fold voltage,
    a non-synchronous boost converter circuit including a fourth inductor coupled between the supplied voltage and a fourth switching node, a fifth transistor coupled between the fourth switching node and ground, and a second diode coupled between the fourth switching node and the r-fold voltage,
    a synchronous buck-boost converter circuit including a sixth transistor coupled between the supplied voltage and a fifth switching node, a seventh transistor coupled between the fifth switching node and ground, a fifth inductor coupled between the fifth switching node and a sixth switching node, an eighth transistor coupled between the sixth switching node and ground, and a ninth transistor coupled between the sixth switching node and the r-fold voltage, and
    a non-synchronous buck-boost converter circuit including a tenth transistor coupled between the supplied voltage and a seventh switching node, a third diode coupled between the fifth switching node and ground, a sixth inductor coupled between the seventh switching node and an eighth switching node, an eleventh transistor coupled between the eighth switching node and ground, and a fourth diode coupled between the eighth switching node and the r-fold voltage.

6. A speaker driver circuit driven by positive and negative voltages, comprising:
    at least one operational amplifier providing an output to a speaker, and
    a voltage converter receiving a supplied voltage, generating r-fold positive and negative voltages (wherein r is any positive real number except 1) according to the supplied voltage, and supplying the positive and negative voltages to the operational amplifier as its high and low operation voltage levels respectively, wherein the voltage converter includes: a DC/DC voltage converter converting the supplied voltage to a negative r-fold voltage; and a negative charge pump converting the negative r-fold voltage to a positive voltage having the same absolute value as the negative r-fold voltage.

* * * * *